(12) United States Patent
Poplavskyy

(10) Patent No.: US 10,367,116 B2
(45) Date of Patent: Jul. 30, 2019

(54) METHOD OF REDUCING SODIUM CONCENTRATION IN A TRANSPARENT CONDUCTIVE OXIDE LAYER OF A SEMICONDUCTOR DEVICE

(71) Applicant: BEIJING APOLLO DING RONG SOLAR TECHNOLOGY CO., LTD, Beijing (CN)

(72) Inventor: Dmitry Poplavskyy, San Jose, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/045,541

(22) Filed: Jul. 25, 2018

(65) Prior Publication Data

US 2018/0331248 A1 Nov. 15, 2018

Related U.S. Application Data

(62) Division of application No. 15/497,578, filed on Apr. 26, 2017, now Pat. No. 10,062,801.

(60) Provisional application No. 62/328,050, filed on Apr. 27, 2016.

(51) Int. Cl.
| | |
|---|---|
| H01L 31/18 | (2006.01) |
| H01L 31/032 | (2006.01) |
| H01L 31/05 | (2014.01) |
| H01L 21/67 | (2006.01) |
| H01L 21/677 | (2006.01) |
| H01L 31/0749 | (2012.01) |
| H01L 31/0445 | (2014.01) |

(52) U.S. Cl.
CPC ...... *H01L 31/1884* (2013.01); *H01L 21/6776* (2013.01); *H01L 21/67115* (2013.01); *H01L 21/67173* (2013.01); *H01L 31/0322* (2013.01); *H01L 31/0445* (2014.12); *H01L 31/0504* (2013.01); *H01L 31/0508* (2013.01); *H01L 31/0512* (2013.01); *H01L 31/0749* (2013.01); *H01L 31/18* (2013.01); *H01L 31/186* (2013.01); *Y02E 10/50* (2013.01); *Y02E 10/541* (2013.01); *Y02P 70/521* (2015.11)

(58) Field of Classification Search
CPC ............. H01L 31/1884; H01L 31/0512; H01L 31/0445; H01L 31/186; H01L 31/18; H01L 31/0749; H01L 31/0322; H01L 31/0504; H01L 21/6776; H01L 31/0508
See application file for complete search history.

(56) References Cited

U.S. PATENT DOCUMENTS

| | | |
|---|---|---|
| 8,134,069 B2 | 3/2012 | Mackie et al. |
| 8,404,512 B1 | 3/2013 | Aksu et al. |
| 8,912,429 B2 | 12/2014 | Wudu et al. |

(Continued)

*Primary Examiner* — Anthony Ho
(74) *Attorney, Agent, or Firm* — The Marbury Law Group PLLC

(57) ABSTRACT

A method of making a semiconductor device includes forming a semiconductor material stack having a sodium at an atomic concentration greater than $1\times10^{19}/cm^3$, depositing a transparent conductive oxide layer over the semiconductor material stack, such that sodium atoms diffuse from the semiconductor material stack into the transparent conductive oxide layer, and contacting a physically exposed surface of the transparent conductive oxide layer with a fluid to remove sodium from the transparent conductive oxide layer.

11 Claims, 7 Drawing Sheets

(56) References Cited

U.S. PATENT DOCUMENTS

| | | |
|---|---|---|
| 9,303,316 B1 | 4/2016 | Shufflebotham et al. |
| 10,062,801 B2 | 8/2018 | Poplavskyy |
| 2014/0227169 A1 | 8/2014 | Nishi et al. |

METHOD OF REDUCING SODIUM CONCENTRATION IN A TRANSPARENT CONDUCTIVE OXIDE LAYER OF A SEMICONDUCTOR DEVICE

BACKGROUND

The present disclosure is directed generally to an apparatus and method for manufacturing a semiconductor device, and specifically to reducing sodium concentration in a transparent conductive electrode of a semiconductor device.

A "thin-film" photovoltaic material refers to a polycrystalline or amorphous photovoltaic material that is deposited as a layer on a substrate that provides structural support. The thin-film photovoltaic materials are distinguished from single crystalline semiconductor materials that have a higher manufacturing cost. Some of the thin-film photovoltaic materials that provide high conversion efficiency include chalcogen-containing compound semiconductor material, such as copper indium gallium selenide (CIGS).

Thin-film photovoltaic cells (also known as solar cells) may be manufactured using a roll-to-roll coating system based on sputtering, evaporation, or chemical vapor deposition (CVD) techniques. A thin foil substrate, such as a foil web substrate, is fed from a roll in a linear belt-like fashion through the series of individual vacuum chambers or a single divided vacuum chamber where it receives the required layers to form the thin-film photovoltaic cells. In such a system, a foil having a finite length may be supplied on a roll. The end of a new roll may be coupled to the end of a previous roll to provide a continuously fed foil layer.

Sodium enhances the electronic properties of some chalcogen-containing compound semiconductor materials (such as CIGS) by reducing density of defects, increasing net carrier concentration, and electrical conductivity, thereby improving the conversion efficiency of a photovoltaic device employing the chalcogen-containing compound semiconductor material. It is believed that sodium achieves such electronic effects through structural modification of the chalcogen-containing compound semiconductor material, which includes increased grain size and texture due to the presence of sodium during growth of the chalcogen-containing compound semiconductor material.

SUMMARY

According to an aspect of the present disclosure, a method of making a semiconductor device includes forming a semiconductor material stack including a p-n junction having a sodium at an atomic concentration greater than $1 \times 10^{19}/cm^3$, depositing a transparent conductive oxide layer over the semiconductor material stack, such that sodium atoms diffuse from the semiconductor material stack into the transparent conductive oxide layer, and contacting a physically exposed surface of the transparent conductive oxide layer with a fluid to remove sodium from the transparent conductive oxide layer.

According to another aspect of the present disclosure, a semiconductor device manufacturing apparatus includes at least one semiconductor deposition module configured to form a semiconductor material stack including a p-n junction on a substrate, a conductive oxide deposition module configured to deposit a transparent conductive oxide layer over the semiconductor material stack, and a fluid treatment module configured to contact a physically exposed surface of the transparent conductive oxide layer with a fluid to remove sodium from the transparent conductive oxide layer.

DETAILED DESCRIPTION

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a direct physical contact between a surface of the first element and a surface of the second element. As used herein, an element is "configured" to perform a function if the structural components of the element are inherently capable of performing the function due to the physical and/or electrical characteristics thereof.

Without wishing to be bound by a particular theory, the present inventor determined that presence of a relatively high amount of sodium on a top surface or in a bulk part of a transparent conductive oxide material, which functions as the top electrode of the photovoltaic cell which directly contacts an electrically conductive interconnect, may be detrimental to the stability of the interconnected photovoltaic cell in ambient conditions. Thus, the embodiments of the present disclosure provide a method of reducing sodium in and/or on the transparent conductive oxide of a photovoltaic cell while employing sodium in an underlying chalcogen-containing compound semiconductor absorber layer to improve the stability of the cell without sacrificing the performance enhancement provided by the sodium in the absorber layer.

Figure 1:
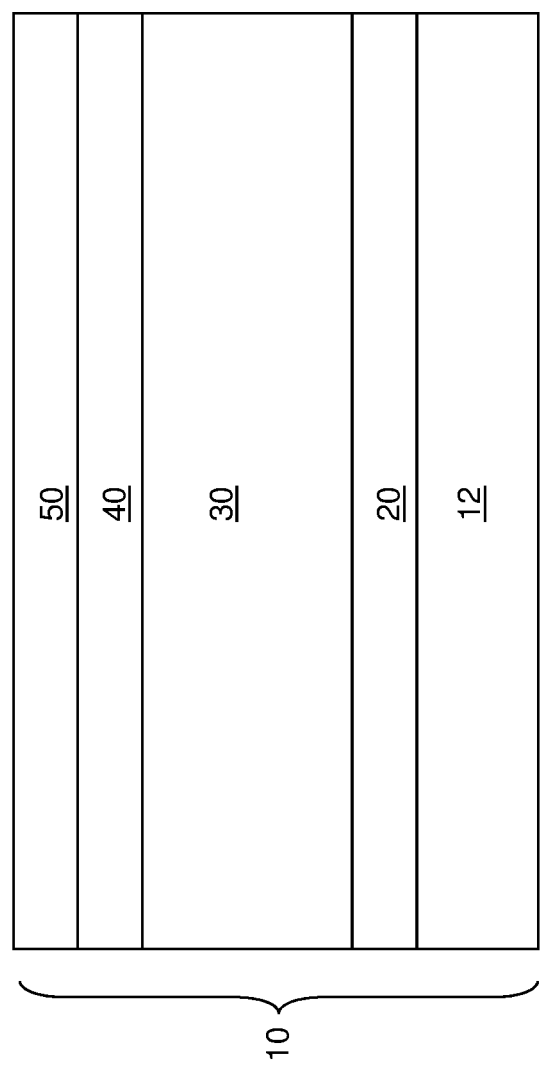
FIG. 1 is a schematic vertical cross sectional view of a thin-film photovoltaic cell according to an embodiment of the present disclosure.

Referring to FIG. 1, a vertical cross-sectional view of a photovoltaic cell 10 is illustrated. The photovoltaic cell 10 includes a substrate, such as an electrically conductive substrate 12, a first electrode 20, a p-doped semiconductor layer 30, an n-doped semiconductor layer 40, a second electrode 50, and an optional antireflective (AR) coating layer (not shown).

The substrate 12 is preferably a flexible, electrically conductive material, such as a metallic foil that is fed into a system of one or more process modules as a web for deposition of additional layers thereupon. For example, the metallic foil of the conductive substrate 12 can be a sheet of a metal or a metallic alloy such as stainless steel, aluminum, or titanium. If the substrate 12 is electrically conductive, then it may comprise a part of the back side (i.e., first) electrode of the cell 10. Thus, the first (back side) electrode of the cell 10 may be designated as (20, 12). Alternatively, the conductive substrate 12 may be an electrically conductive or insulating polymer foil. Still alternatively, the substrate 12 may be a stack of a polymer foil and a metallic foil. In another embodiment, the substrate 12 may be a rigid glass substrate or a flexible glass substrate. The thickness of the substrate 12 can be in a range from 100 microns to 2 mm, although lesser and greater thicknesses can also be employed.

The first or back side electrode 20 may comprise any suitable electrically conductive layer or stack of layers. For example, electrode 20 may include a metal layer, which may be, for example, molybdenum. Alternatively, a stack of molybdenum and sodium and/or oxygen doped molybdenum layers may be used instead, as described in U.S. Pat. No. 8,134,069, which is incorporated herein by reference in its entirety. In another embodiment, the first electrode 20 can include a molybdenum material layer doped with K and/or Na, i.e., $MoK_x$ or $Mo(Na,K)_x$, in which x can be in a range from $1.0\times10^{-6}$ to $1.0\times10^{-2}$. The electrode 20 can have a thickness in a range from 500 nm to 1 micron, although lesser and greater thicknesses can also be employed.

The p-doped semiconductor layer 30 can include a p-type sodium doped copper indium gallium selenide (CIGS), which functions as a semiconductor absorber layer. The thickness of the p-doped semiconductor layer 30 can be in a range from 1 microns to 5 microns, although lesser and greater thicknesses can also be employed.

The n-doped semiconductor layer 40 includes an n-doped semiconductor material such as CdS, ZnS, ZnSe, or an alternative metal sulfide or a metal selenide. The thickness of the n-doped semiconductor layer 40 is typically less than the thickness of the p-doped semiconductor layer 30, and can be in a range from 30 nm to 100 nm, although lesser and greater thicknesses can also be employed. The junction between the p-doped semiconductor layer 30 and the n-doped semiconductor layer 40 is a p-n junction. The n-doped semiconductor layer 40 can be a material which is substantially transparent to at least part of the solar radiation. The n-doped semiconductor layer 40 is also referred to as a window layer or a buffer layer.

Figure 6:
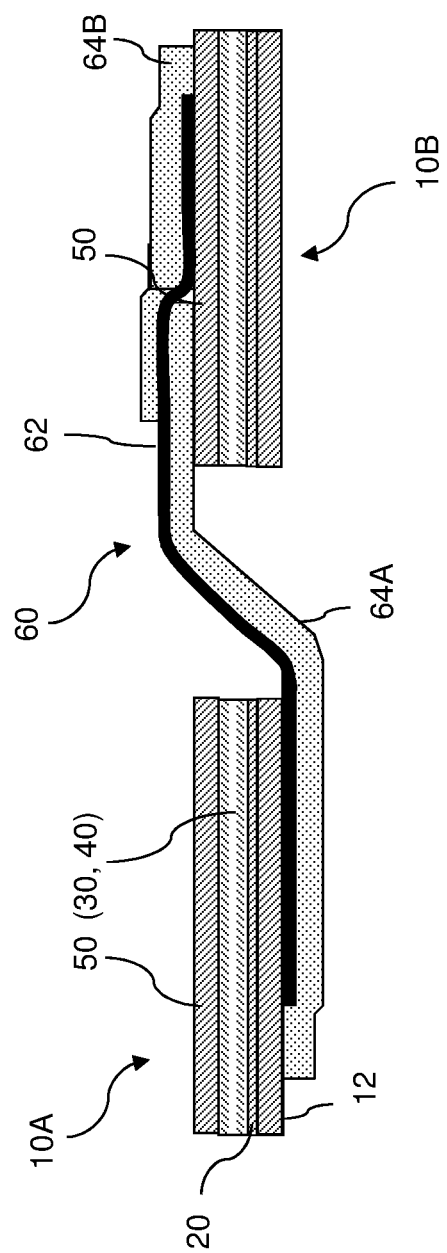
FIG. 6 is a schematic vertical cross sectional view of two thin-film photovoltaic cells that are interconnected by an interconnect after the sodium removal step according to an embodiment of the present disclosure.

The second (e.g., front side or top) electrode 50 comprises one or more transparent conductive layers 50. The transparent conductive layer 50 is conductive and substantially transparent. The transparent conductive layer 50 can include one or more transparent conductive materials, such as ZnO, indium tin oxide (ITO), Al doped ZnO ("AZO"), Boron doped ZnO ("BZO"), or a combination or stack of higher resistivity AZO and lower resistivity ZnO, ITO, AZO and/or BZO layers. The second electrode 50 contacts an electrically conductive part 62 (e.g., a metal wire or trace) of an interconnect 60, as shown in FIG. 6. The interconnect 60 may optionally contain one or more insulating sheets, such as optically transparent polymer sheets 64A, 64B which support the electrically conductive part 62. The electrically conductive part 62 electrically connects the first electrode (20, 12) of one photovoltaic cell 10A to the second electrode 50 of an adjacent photovoltaic cell 10B in a photovoltaic panel (i.e., module). The interconnect 60 may comprise the interconnect described in U.S. Pat. No. 8,912,429, issued Dec. 16, 2014, which is incorporated herein by reference in its entirety, or any other suitable interconnect that is used in photovoltaic panels.

Figure 2:
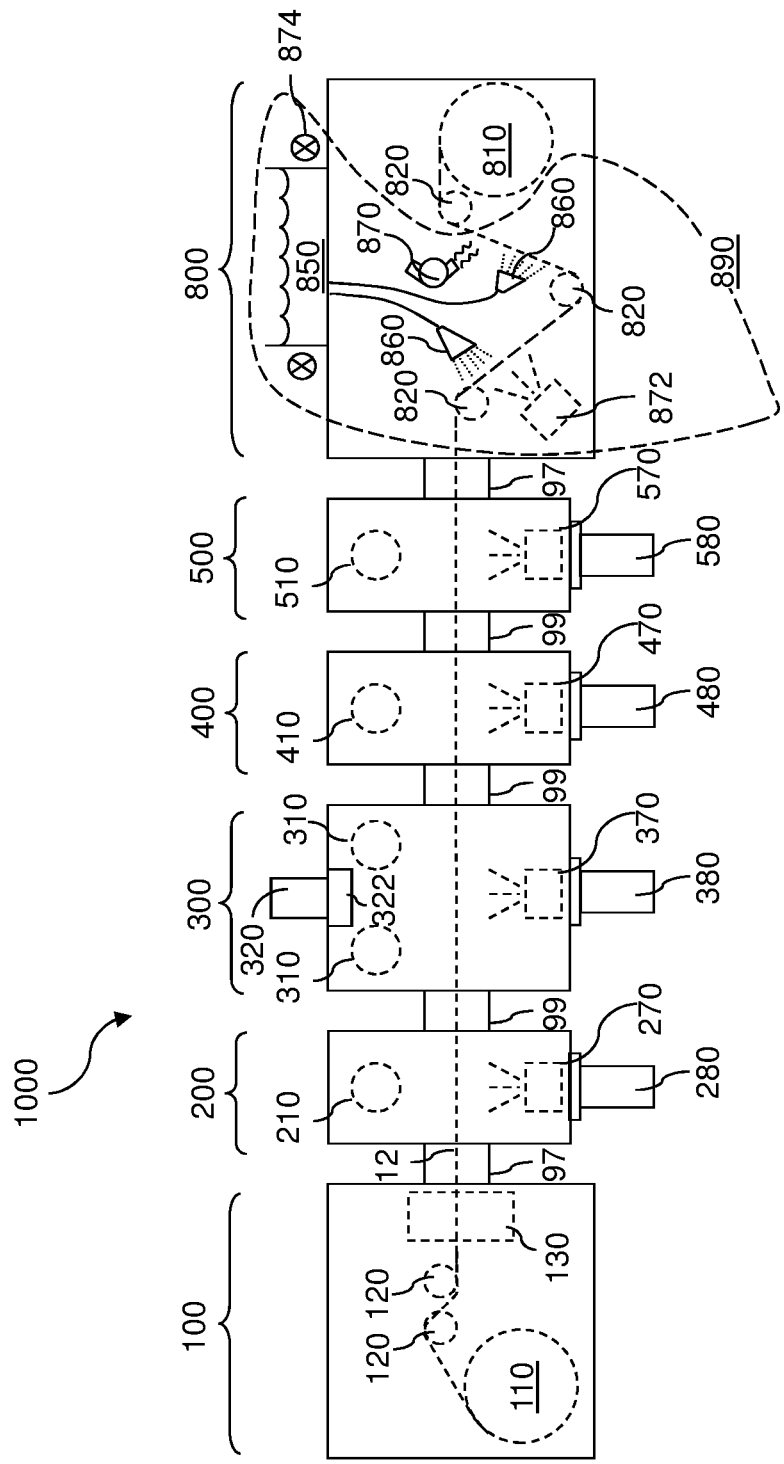
FIG. 2 is a schematic diagram of a first exemplary modular deposition apparatus that can be used to manufacture the photovoltaic cell illustrated in FIG. 1 according to an embodiment of the present disclosure.

Referring now to FIG. 2, an apparatus 1000 for forming the photovoltaic cell 10 illustrated in FIG. 1 is shown. The apparatus 1000 is a first exemplary modular deposition apparatus that can be used to manufacture the photovoltaic cell illustrated in FIG. 1. The apparatus 1000 includes an input unit 100, a first process module 200, a second process module 300, a third process module 400, a fourth process module 500, and an output unit 800 that are sequentially connected to accommodate a continuous flow of the substrate 12 in the form of a web foil substrate layer through the apparatus. The modules (100, 200, 300, 400, 500) may comprise the modules described in U.S. Pat. No. 9,303,316, issued on Apr. 5, 2016, incorporated herein by reference in its entirety, or any other suitable modules. The first, second, third, and fourth process modules (200, 300, 400, 500) can be under vacuum by first, second, third, and fourth vacuum pumps (280, 380, 480, 580), respectively. The first, second, third, and fourth vacuum pumps (280, 380, 480, 580) can provide a suitable level of respective base pressure for each of the first, second, third, and fourth process modules (200, 300, 400, 500), which may be in a range from $1.0\times10^{-9}$ Torr to $1.0\times10^{-2}$ Torr, and preferably in range from $1.0\times10^{-9}$ Torr to $1.0\times10^{-5}$ Torr.

Each neighboring pair of process modules (200, 300, 400, 500) is interconnected employing a vacuum connection unit 99, which can include a vacuum tube and an optional slit valve that enables isolation while the substrate 12 is not present. The input unit 100 can be connected to the first process module 200 employing a sealing connection unit 97. The last process module, such as the fourth process module 500, can be connected to the output unit 800 employing another sealing connection unit 97.

The substrate 12 can be a metallic or polymer web foil that is fed into a system of process modules (200, 300, 400, 500) as a web for deposition of material layers thereupon to form the photovoltaic cell 10. The substrate 12 can be fed from an entry side (i.e., at the input module 100), continuously move through the apparatus 1000 without stopping, and exit the apparatus 1000 at an exit side (i.e., at the output module 800). The substrate 12, in the form of a web, can be provided on an input spool 110 provided in the input module 100.

The substrate 12, as embodied as a metal or polymer web foil, is moved throughout the apparatus 1000 by input-side rollers 120, output-side rollers 820, and additional rollers (not shown) in the process modules (200, 300, 400, 500), vacuum connection units 99, or sealing connection units 97, or other devices. Additional guide rollers may be used. Some rollers (120, 820) may be bowed to spread the web (i.e., the substrate 12), some may move to provide web steering, some may provide web tension feedback to servo controllers, and others may be mere idlers to run the web in desired positions.

The input module 100 can be configured to allow continuous feeding of the substrate 12 by adjoining multiple foils by welding, stapling, or other suitable means. Rolls of substrates 12 can be provided on multiple input spools 110. A joiner device 130 can be provided to adjoin an end of each roll of the substrate 12 to a beginning of the next roll of the substrate 12. In one embodiment, the joinder device 130 can be a welder or a stapler. An accumulator device (not shown) may be employed to provide continuous feeding of the substrate 12 into the apparatus 1000 while the joinder device 130 adjoins two rolls of the substrate 12.

In one embodiment, the input module 100 may perform pre-processing steps. For example, a pre-clean process may be performed on the substrate 12 in the input module 100. In one embodiment, the substrate 12 may pass by a heater array (not shown) that is configured to provide at least enough heat to remove water adsorbed on the surface of the substrate 12. In one embodiment, the substrate 12 can pass over a roller configured as a cylindrical rotary magnetron. In this case, the front surface of substrate 12 can be continuously cleaned by DC, AC, or RF sputtering as the substrate 12 passes around the roller/magnetron. The sputtered material from the substrate 12 can be captured on a disposable shield. Optionally, another roller/magnetron may be employed to clean the back surface of the substrate 12. In one embodiment, the sputter cleaning of the front and/or back surface of the substrate 12 can be performed with linear ion guns instead of magnetrons. Alternatively or additionally, a cleaning process can be performed prior to loading the roll of the substrate 12 into the input module 100. In one embodiment, a corona glow discharge treatment may be performed in the input module 100 without introducing an electrical bias.

The output module 800 can include an output spool 810, which winds the web embodying the photovoltaic cell 10. The photovoltaic cell 10 is the combination of the substrate 12 and the deposited layers (20, 30, 40, 50) thereupon.

In one embodiment, the substrate 12 may be oriented in one direction in the input module 100 and/or in the output module 800, and in a different direction in the process modules (200, 300, 400, 500). For example, the substrate 12 can be oriented generally horizontally in the input module 100 and the output module 800, and generally vertically in the process module(s) (200, 300, 400, 500). A turning roller or turn bar (not shown) may be provided to change the orientation of the substrate 12, such as between the input module 100 and the first process module 200. In an illustrative example, the turning roller or the turn bar in the input module can be configured to turn the web substrate 12 from an initial horizontal orientation to a vertical orientation. Another turning roller or turn bar (not shown) may be provided to change the orientation of the substrate 12, such as between the last process module (such as the fourth process module 500) and the output module 800. In an illustrative example, the turning roller or the turn bar in the input module can be configured to turn the web substrate 12 from the vertical orientation employed during processing in the process modules (200, 300, 400, 500) to a horizontal orientation.

The input spool 110 and optional output spool 810 may be actively driven and controlled by feedback signals to keep the substrate 12 in constant tension throughout the apparatus 1000. In one embodiment, the input module 100 and the output module 800 can be maintained in the air ambient at all times while the process modules (200, 300, 400, 500) are maintained at vacuum during layer deposition. The web is treated with deionized water in a fluid treatment module 890, such as a water treatment module, within the output module 800 in a manner to be subsequently described in detail below prior to being rolled onto the output spool 810.

Figure 3:
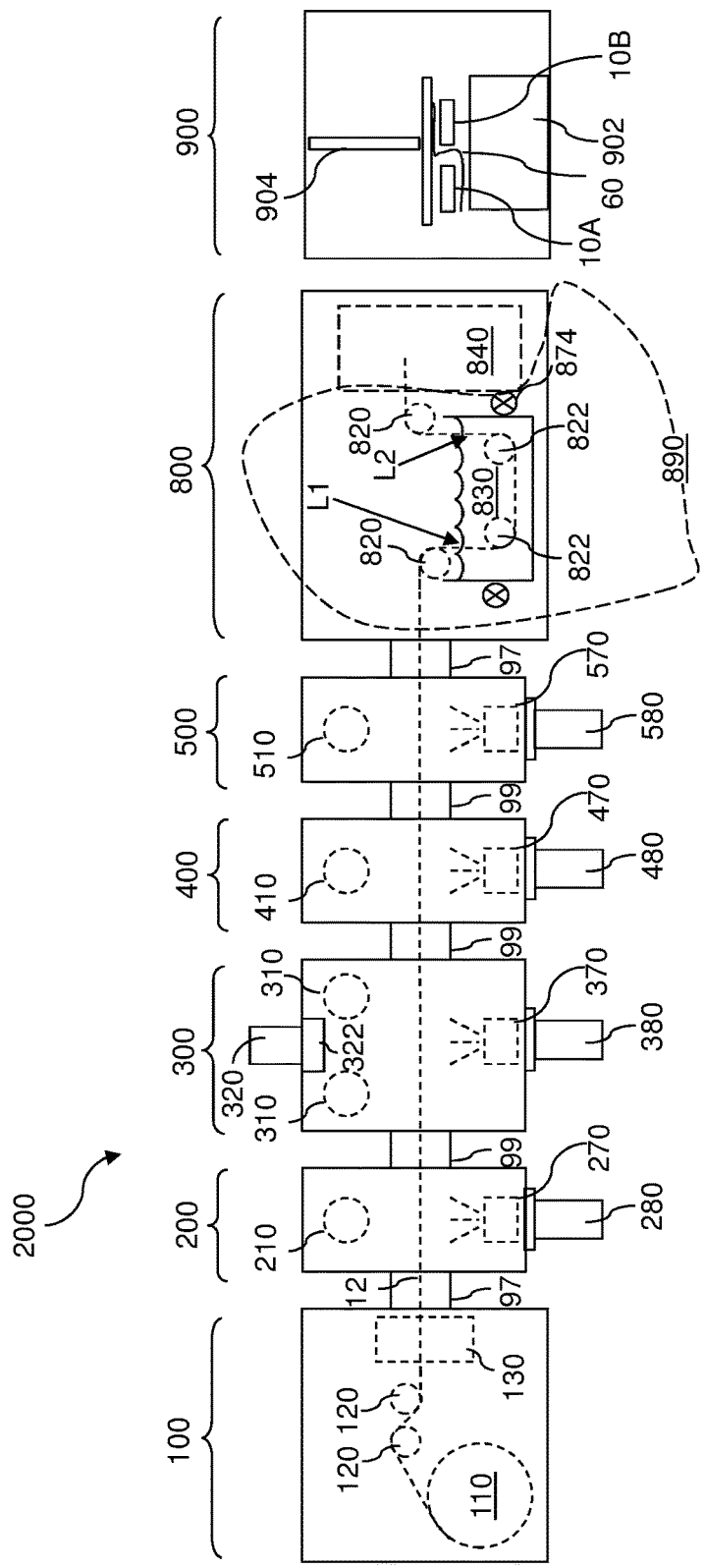
FIG. 3 is a schematic diagram of a second exemplary modular deposition apparatus that can be used to manufacture the photovoltaic cell illustrated in FIG. 1 according to another embodiment of the present disclosure.

Referring to FIG. 3, a second exemplary modular deposition apparatus 2000 is illustrated, which can be used to manufacture the photovoltaic cell illustrated in FIG. 1. The second exemplary modular deposition apparatus 2000 includes an alternative output module 800, which includes a cutting apparatus 840 instead of an output spool 810. The web is treated with deionized water in a water treatment module 890 within the output module 800 in a manner to be subsequently described below in detail. After treatment with the deionized water, the web containing layers (20, 30, 40, 50) of the photovoltaic cell 10 on the substrate 12 can be fed into the cutting apparatus 840 in the output module 800, and can be cut into discrete sheets (e.g., strip or rectangular shaped sheets) instead of being rolled onto an output spool 810. Each discrete sheet comprises one photovoltaic cell 10. The photovoltaic cells 10 are then interconnected with interconnects 60 as shown in FIG. 6 to form a photovoltaic panel (i.e., a solar module) which contains an electrical output. Thus, in the embodiment of FIG. 3, the cutting apparatus 840 is located downstream of the water treatment module 890 in the web movement direction such that the photovoltaic cells 10 are exposed to the fluid (e.g., rinsed with water) before the cutting step.

Figure 4:
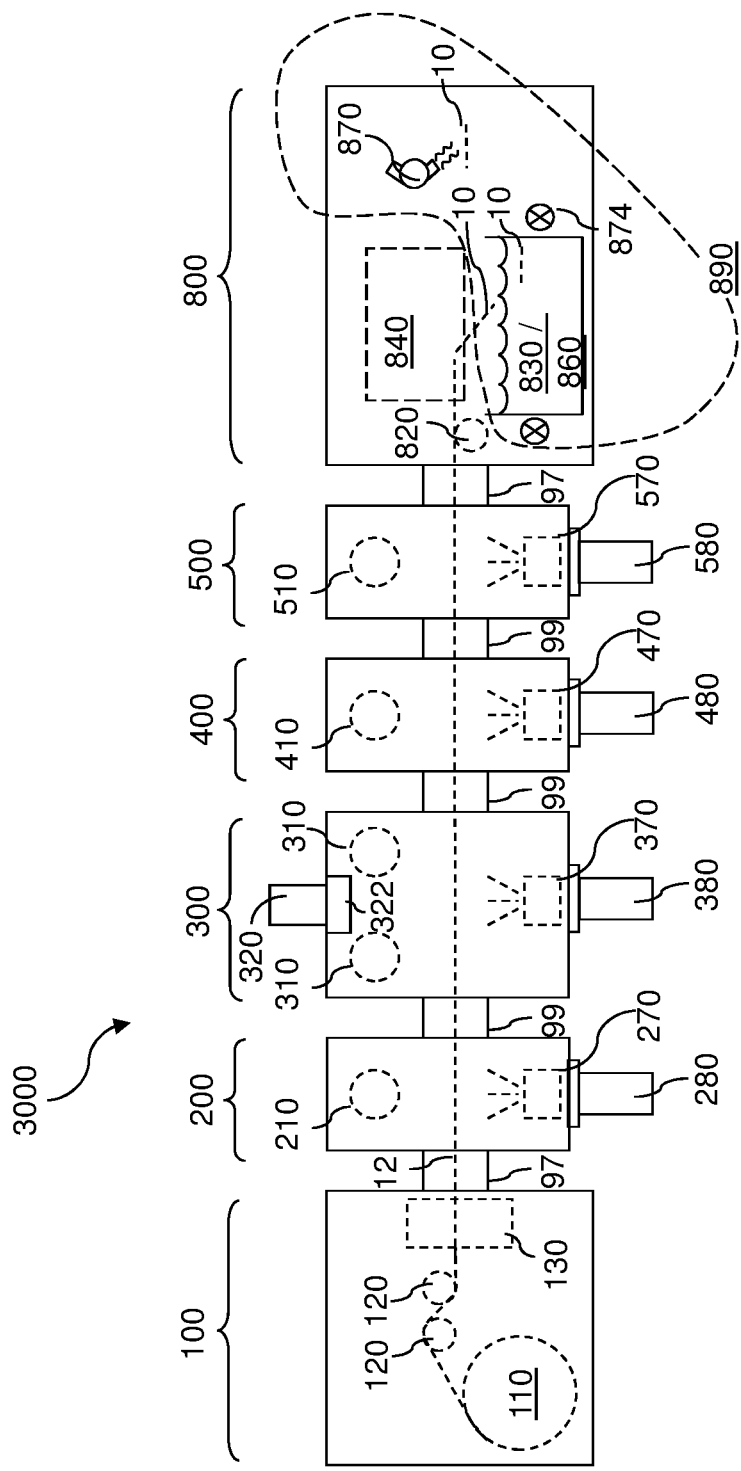
FIG. 4 is a schematic diagram of a third exemplary modular deposition apparatus that can be used to manufacture the photovoltaic cell illustrated in FIG. 1 according to another embodiment of the present disclosure.

Referring to FIG. 4, a third exemplary modular deposition apparatus 3000 is illustrated, which can be used to manufacture the photovoltaic cell illustrated in FIG. 1. The third exemplary modular deposition apparatus 3000 includes another alternate output module 800, which includes a cutting apparatus 840 instead of an output spool 810. The web containing layers (20, 30, 40, 50) of the photovoltaic cell 10 on the substrate 12 can be fed into the cutting apparatus 840 in the output module 800, and can be cut into discrete sheets (e.g., into photovoltaic cells 10) instead of being rolled onto an output spool 810. The cut-up photovoltaic cells 10 are then treated with deionized water in a water treatment module 890 within the output module 800 in a manner to be subsequently described herein in detail. Thus, in the embodiment of FIG. 4, the cutting apparatus 840 is located upstream of the water treatment module 890 in the web movement direction such that the photovoltaic cells 10 are exposed to the fluid (e.g., rinsed with water) after the cutting step, rather than before the cutting step as shown in FIG. 3.

Figure 5:
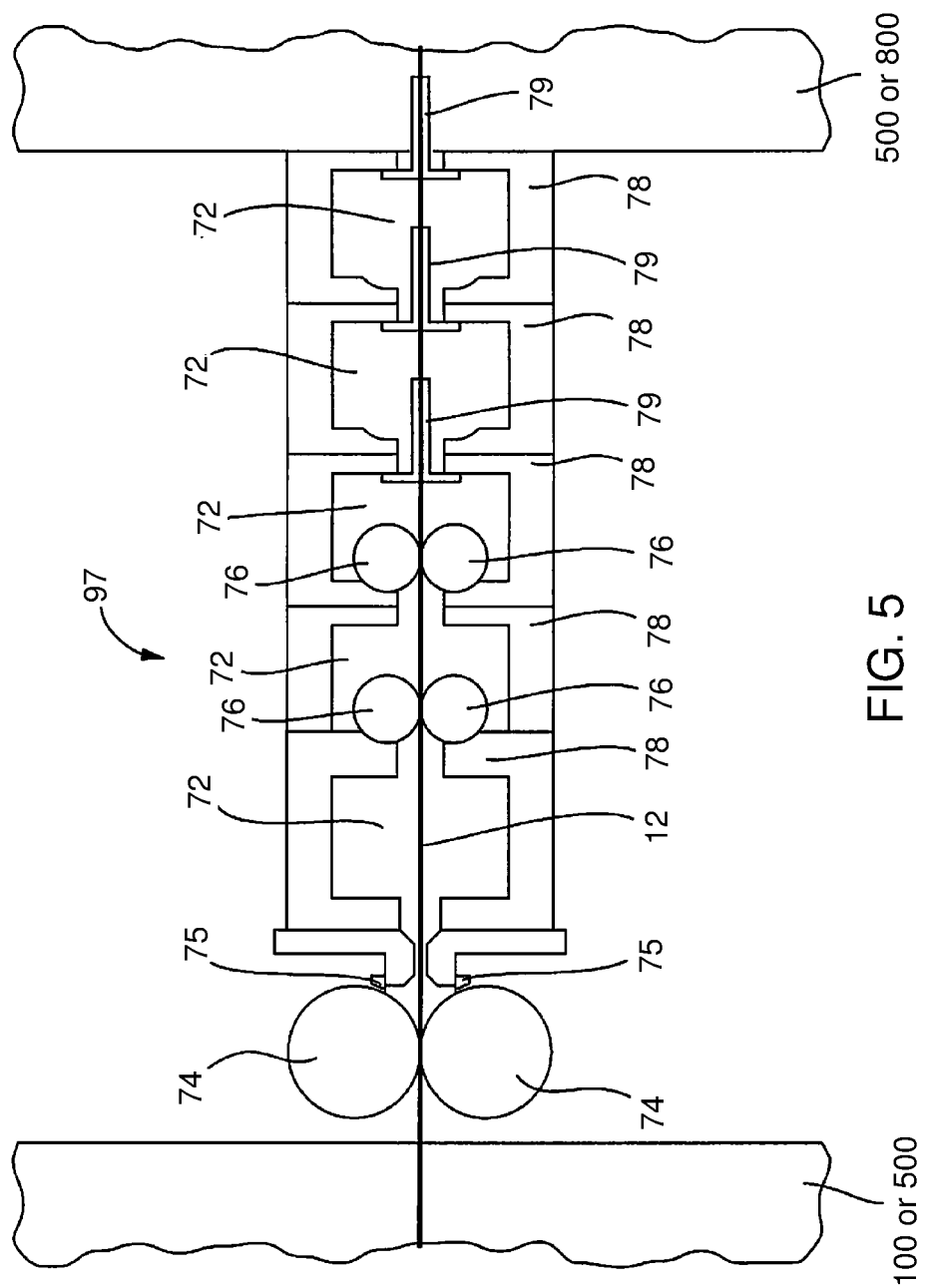
FIG. 5 is a schematic diagram of an exemplary sealing connection unit according to an embodiment of the present disclosure.

Referring to FIG. 5, an exemplary sealing connection unit 97 is illustrated. The unit may comprise the unit described in U.S. Pat. No. 9,303,316, issued on Apr. 5, 2016, incorporated herein by reference in its entirety, or any other suitable unit. The sealing connection unit 97 is configured to allow the substrate 12 to pass out of a preceding unit (such as the input unit 100 or the last processing chamber such as the fourth process module 500) and into a subsequent unit (such as the first process module 200 or the output unit 800), while impeding the passage of gasses such as atmospheric gasses or processing gasses into or out of the units that the sealing connection unit 97 is adjoined to. The sealing connection unit 97 can include multiple isolation chambers 72. The staged isolation chambers 72 can be configured to maintain internal pressures that graduate from atmospheric on a first side of the sealing connection unit 97 (such as the side of the input module 100 or the output module 800) to a high vacuum on the second side of the sealing connection unit 97 opposite of the first side (such as the side of the first process module 200 or the last process module 500). Multiple isolation chambers 72 can be employed to ensure that the pressure difference at any sealing surface is generally less than the pressure difference between atmospheric pressure and the high vacuum inside the process module.

The substrate 12 enters the sealing mechanism 97 between two external nip rollers 74. Each of the isolation chambers 72 of the sealing connection unit 97 can be separated by an internal divider 78, which is an internal wall among the isolation chambers 72. A pair of internal nip rollers 76, similar in function and arrangement to that of the external rollers 74, may be provided proximate to the internal dividers 78 between some of the neighboring internal chambers 72. The passage between the internal rollers 76 is generally closed off by rolling seals between the internal rollers 76 and the substrate 12. The internal dividers 78 may include curved sockets or contours that are configured to receive internal rollers 76 of a similar radius of curvature. The passage of gasses from one isolation chamber 72 to a neighboring, lower pressure internal chamber 72 may be reduced by a simple surface to surface contact between the internal roller 76 and the divider 78. In other embodiments, a seal such as a wiper seal may be provided for some or all of the internal rollers 76 to further reduce the infiltration of gasses into neighboring isolation chambers 72. The internal rollers 76 may be freely spinning rollers, or may be powered to control the rate of passage of the substrate 12 through the sealing connection unit 97. Between other chambers 72, the passage of gasses between neighboring chambers 72 may be limited by parallel plate conductance limiters 79. The parallel plate conductance limiters 79 are generally flat, parallel plates that are arranged parallel to the surface of the substrate 12 and are spaced apart a distance slightly larger than the thickness of the substrate 12. The parallel plate conductance limiters 79 allow the substrate to pass between the chambers 72 while limiting the passage of gasses between chambers 72.

In one embodiment, the sealing connection unit 97 may also include inert gas purge at the in-feed nip. In one embodiment, the sealing connection unit 97 may also include optional reverse crown or spreading rollers. The difference in pressure between neighboring chambers may deform the internal rollers 76, causing them to deflect or crown towards the chamber with a lower pressure. The reverse crown rollers are placed such that they correct for vacuum-induced deflection of the internal rollers 76. Thus, other than the slight deformation corrected by the reverse crown rollers, the sealing connection unit 97 is configured to pass the web substrate without bending or turning or scratching the web substrate 12.

Referring back to FIGS. 2, 3, and 4, each of the first, second, third, and fourth process modules (200, 300, 400, 500) can deposit a respective material layer to form the photovoltaic cell 10 (shown in FIG. 1) as the substrate 12 passes through the first, second, third, and fourth process modules (200, 300, 400, 500) sequentially.

Optionally, one or more additional process modules (not shown) may be added between the input module 100 and the first process module 200 to sputter a back side protective layer on the back side of the substrate 12 before deposition of the first electrode 20 in the first process module 200. Further, one or more barrier layers may be sputtered over the front surface of the substrate 12 prior to deposition of the first electrode 20. Alternatively or additionally, one or more process modules (not shown) may be added between the first process module 200 and the second process module 300 to sputter one or more adhesion layers between the first electrode 20 and the p-doped semiconductor layer 30 including a chalcogen-containing compound semiconductor material.

The first process module 200 includes a first sputtering target 210, which includes the material of the first electrode 20 in the photovoltaic cell 10 illustrated in FIG. 1. A first heater 270 can be provided to heat the web substrate 12 to an optimal temperature for deposition of the first electrode 20. In one embodiment, a plurality of first sputtering sources 210 and a plurality of first heaters 270 may be employed in the first process module 200. In one embodiment, the at least one first sputtering target 210 can be mounted on dual cylindrical rotary magnetron(s), or planar magnetron(s) sputtering sources, or RF sputtering sources. In one embodiment, the at least one first sputtering target 210 can include a molybdenum target, a molybdenum-sodium, and/or a molybdenum-sodium-oxygen target, as described in U.S. Pat. No. 8,134,069, incorporated herein by reference in its entirety.

The portion of the substrate 12 on which the first electrode 20 is deposited is moved into the second process module 300. A p-doped chalcogen-containing compound semiconductor material is deposited to form the p-doped semiconductor layer 30, such as a sodium doped CIGS absorber layer. In one embodiment, the p-doped chalcogen-containing compound semiconductor material can be deposited employing reactive alternating current (AC) magnetron sputtering in a sputtering atmosphere that includes argon and a chalcogen-containing gas at a reduce pressure. In one embodiment, multiple metallic component targets 310 including the metallic components of the p-doped chalcogen-containing compound semiconductor material can be provided in the second process module 300.

As used herein, the "metallic components" of a chalcogen-containing compound semiconductor material refers to the non-chalcogenide components of the chalcogen-containing compound semiconductor material. For example, in a copper indium gallium selenide (CIGS) material, the metallic components include copper, indium, and gallium. The metallic component targets 310 can include an alloy of all non-metallic materials in the chalcogen-containing compound semiconductor material to be deposited. For example, if the chalcogen-containing compound semiconductor material is a CIGS material, the metallic component targets 310 can include an alloy of copper, indium, and gallium. More than two targets 310 may be used.

At least one chalcogen-containing gas source 320, such as a selenium evaporator, and at least one gas distribution manifold 322 can be provided on the second process module 300 to provide a chalcogen-containing gas into the second process module 300. The chalcogen-containing gas provides chalcogen atoms that are incorporated into the deposited chalcogen-containing compound semiconductor material. While FIGS. 2, 3 and 4 schematically illustrate a second process module 300 including two metallic component targets 310, a single chalcogen-containing gas source 320, and a single gas distribution manifold 322, multiple instances of the chalcogen-containing gas source 320 and/or the gas distribution manifold 322 can be provided on the second process module 300.

Generally speaking, the second process module 300 can be provided with multiple sets of chalcogen-containing compound semiconductor material deposition units. As many chalcogen-containing compound semiconductor material deposition units can be provided along the path of the substrate 12 as is needed to achieve the desired thickness for the p-doped chalcogen-containing compound semiconductor material. The number of second vacuum pumps 380 may, or may not, coincide with the number of the deposition units. The number of second heaters 370 may, or may not, be commensurate with the number of the deposition units.

The chalcogen-containing gas source 320 includes a source material for the chalcogen-containing gas. The species of the chalcogen-containing gas can be selected to enable deposition of the target chalcogen-containing compound semiconductor material to be deposited. For example, if a CIGS material is to be deposited for the p-doped semiconductor layer 30, the chalcogen-containing gas may be selected, for example, from hydrogen selenide ($H_2Se$) and selenium vapor. In case the chalcogen-containing gas is hydrogen selenide, the chalcogen-containing gas source 320 can be a cylinder of hydrogen selenide. In case the chalcogen-containing gas is selenium vapor, the chalcogen-containing gas source 320 can be an effusion cell that can be heated to generate selenium vapor. Each second heater 370 can be a radiation heater that maintains the temperature of the web substrate 12 at the deposition temperature, which can be in a range from 400° C. to 800° C., such as a range from 500° C. to 700° C., which is preferable for CIGS deposition.

The chalcogen incorporation during deposition of the chalcogen-containing compound semiconductor material determines the properties and quality of the chalcogen-containing compound semiconductor material in the p-doped semiconductor layer 30. When the chalcogen-containing gas is supplied in the gas phase at an elevated temperature, the chalcogen atoms from the chalcogen-containing gas can be incorporated into the deposited film by absorption and subsequent bulk diffusion. This process is referred to as chalcogenization, in which complex interactions occur to form the chalcogen-containing compound semiconductor material. The p-type doping in the p-doped semiconductor layer 30 is induced by controlling the degree of deficiency of the amount of chalcogen atoms with respect the amount of non-chalcogen atoms (such as copper atoms, indium atoms, and gallium atoms in the case of a CIGS material) deposited from the metallic component targets 310.

In one embodiment, each metallic component target 310 can be employed with a respective magnetron (not expressly shown) to deposit a chalcogen-containing compound semiconductor material with a respective composition. In one embodiment, the composition of the metallic component targets 310 can be gradually changed along the path of the substrate 12 so that a graded chalcogen-containing compound semiconductor material can be deposited in the second process module 300. For example, if a CIGS material is deposited as the chalcogen-containing compound semiconductor material of the p-doped semiconductor layer 30, the atomic percentage of gallium of the deposited CIGS material can increase as the substrate 12 progresses through the second process module 300. In this case, the p-doped CIGS material in the p-doped semiconductor layer 30 of the photovoltaic cell 10 can be graded such that the band gap of the p-doped CIGS material increases with distance from the interface between the first electrode 20 and the p-doped semiconductor layer 30.

In one embodiment, the total number of metallic component targets 310 may be in a range from 3 to 20. In an illustrative example, the composition of the deposited chalcogen-containing compound semiconductor material can be graded such that the band gap of the p-doped CIGS material changes gradually or in discrete steps with distance from the interface between the first electrode 20 and the p-doped semiconductor layer 30.

While the present disclosure is described employing an embodiment in which metallic component targets 310 are employed in the second process module 300, embodiments are expressly contemplated herein in which each, or a subset, of the metallic component targets 310 is replaced with a pair of two sputtering sources (such as a copper target and an indium-gallium alloy target), or with a set of three supper targets (such as a copper target, an indium target, and a gallium target).

According to an aspect of the present disclosure, a sodium-containing material is provided within, or over, the substrate 12. In one embodiment, sodium can be introduced into the deposited chalcogen-containing compound semiconductor material by employing a sodium-containing metal (e.g., sodium-molybdenum alloy) to deposit the first electrode 20 in the first processing module 200, by providing a substrate 12 including sodium as an impurity, and/or by providing sodium into layer 30 during deposition by including sodium in the target 310 and/or by providing a sodium containing vapor into the module 300.

The portion of the substrate 12 on which the first electrode 20 and the p-doped semiconductor layer 30 are deposited is subsequently passed into the third process module 400. An n-doped semiconductor material is deposited in the third process module 400 to form the n-doped semiconductor layer 40 illustrated in the photovoltaic cell 10 of FIG. 1. The third process module 400 can include, for example, a third sputtering target 410 (e.g., a CdS target) and a magnetron (not expressly shown). The third sputtering target 410 can include, for example, a rotating AC magnetron, an RF magnetron, or a planar magnetron. A heater 470 may be located in the module 400.

Subsequently, an n-type semiconductor layer 40, such as a n-type CdS window layer is deposited over the p-type absorber layer 30 to form a p-n junction. Sodium atoms diffuse from the substrate 12 and/or from the first electrode 20 into the deposited semiconductor materials to form a material stack (30, 40) including sodium at the atomic concentration greater than $1 \times 10^{19}/cm^3$. Specifically, sodium provided in the first electrode 20 or in the substrate 12 can diffuse into the deposited chalcogen-containing compound semiconductor material during deposition of the chalcogen-containing compound semiconductor material. The sodium concentration in the deposited chalcogen-containing compound semiconductor material can be in a range from $1.0 \times 10^{19}/cm^3$ to $5 \times 10^{20}/cm^3$. The sodium atoms tend to pile up at a high concentration near the growth surface of the chalcogen-containing compound semiconductor material, thereby causing the sodium atoms to travel forward as the deposition process progresses.

Sodium atoms in the p-doped semiconductor layer 30 can diffuse into the n-doped semiconductor layer 40 during deposition of the n-doped semiconductor layer 40. Because the underlying surface portion of the p-doped semiconductor layer 30 has a high sodium concentration and because the n-doped semiconductor layer 40 is relative thin (with a typical thickness less than 100 nm), sodium atoms can diffuse from the p-doped semiconductor layer 30 into the n-doped semiconductor layer 40 during deposition of the n-doped semiconductor layer 40. Thus, sodium atoms can be at a relative high concentration in the n-doped semiconductor layer 40. For example, the atomic concentration of sodium in the n-doped semiconductor layer 40 can be in a range from $1.0 \times 10^{19}/cm^3$ to $5.0 \times 10^{20}/cm^3$, although lesser and greater sodium concentrations can also occur.

Thus, a material stack (30, 40) including a p-n junction is formed on the substrate 12. In one embodiment, the material stack (30, 40) can comprise a stack of a p-doped metal chalcogenide semiconductor layer (as the p-doped semiconductor layer 30) and an n-doped metal chalcogenide semiconductor layer (as the n-doped semiconductor layer 40). In one embodiment, the p-doped metal chalcogenide semiconductor layer can comprise copper indium gallium selenide (CIGS), and the n-doped metal chalcogenide semiconductor layer can comprise a material selected from a metal selenide, a metal sulfide (e.g., CdS), and an alloy thereof. The material stack (30, 40) can include sodium at an atomic concentration greater than $1 \times 10^{19}/cm^3$ (such as about $1 \times 10^{20}/cm^3$).

The portion of the substrate 12 on which the first electrode 20, the p-doped semiconductor layer 30, and the n-doped semiconductor layer 40 are deposited is subsequently passed into the fourth process module 500. A transparent conductive oxide material is deposited in the fourth process module 500 to form the second electrode comprising a transparent conductive layer 50 illustrated in the photovoltaic cell 10 of FIG. 1. The fourth process module 400 can include, for example, a fourth sputtering target 510 and a magnetron (not expressly shown). The fourth sputtering target 510 can include, for example, a ZnO, AZO or ITO target and a rotating AC magnetron, an RF magnetron, or a planar magnetron. A transparent conductive oxide layer 50 is deposited over the material stack (30, 40) including the p-n junction. In one embodiment, the transparent conductive oxide layer 50 can comprise a material selected from tin-doped indium oxide, aluminum-doped zinc oxide, and zinc oxide. In one embodiment, the transparent conductive oxide layer 50 can have a thickness in a range from 60 nm to 1,800 nm.

Sodium atoms diffuse from the material stack (30, 40) into the transparent conductive oxide layer 50 during deposition of the transparent conductive oxide layer 50. Without wishing to be bound by a particular theory, it is believed that the sodium concentration in the transparent conductive oxide layer 50 is lower than the peak sodium concentration in the material stack (30, 40). In one embodiment, the sodium concentration in the transparent conductive oxide layer 50 may be on the same order of magnitude (e.g., less than ten times lower) as the average sodium concentration in the material stack (30, 40).

Subsequently, the web substrate 12 passes into the output module 800. The substrate 12 can be wound onto the output spool 810 (which may be a take up spool) as illustrated in FIG. 2, or can be sliced into photovoltaic cells using a cutting apparatus 840 as illustrated in FIGS. 3 and 4.

According to an aspect of the present disclosure, the surface and/or bulk sodium concentration in the transparent oxide material of the transparent conductive oxide layer 50 is reduced by contacting (e.g., rinsing) a physically exposed surface of the transparent conductive oxide layer 50 in the output module 800 with a fluid which removes sodium before followed by placing the interconnect 60 in electrical contact with the transparent conductive oxide layer (i.e., with the second electrode) 50. The fluid may comprise any liquid or vapor which removes sodium from the surface and/or bulk of layer 50. For example, the fluid may comprise liquid water, such as liquid deionized water, water vapor and/or an organic cleaning solution. The rinsing of the physically exposed surface of the transparent conductive oxide layer 50 with the fluid, such as deionized water, can occur while sodium atoms diffuse from inside the transparent conductive oxide layer 50 to the physically exposed surface of the transparent conductive oxide layer 50 that contacts the deionized water.

As used herein, "deionized water" includes both type II water as defined by the U.S. National Committee for Clinical Laboratory Standards (NCCLS) (which is now Clinical and Laboratory Standards Institute (CLSI) in 1988, and having resistivity at 25 degrees Celsius greater than 1 MΩ·cm, and type I water as defined by NCCLS in 1988 and having resistivity at 25 degrees Celsius greater than 10 MΩ·cm.

In one embodiment, the substrate 12 can be provided as a web substrate on which the material stack (30, 40) and the transparent conductive oxide layer 50 are deposited while the web substrate 12 moves through respective deposition chambers. In this case, the web substrate 12 can be continuously moved to a location at which the deionized water is applied to the physically exposed surface of the transparent conductive oxide layer 50 prior to cutting the web substrate 12 to enable continuous processing. In case a cutting apparatus 840 is employed, the front surface of the transparent conductive oxide layer 50 may be treated with the deionized water prior to or after cutting the web substrate 12 employing the cutting apparatus 840, as shown in FIGS. 3 and 4, respectively.

In one embodiment, the deionized water can be applied to the physically exposed surface of the transparent conductive oxide layer 50 by spraying as illustrated in FIG. 2. The spraying operation can be performed employing at least one spray device 860 configured to spray the fluid, such as deionized water, on the physically exposed surface of the transparent conductive oxide layer 50 located over the front surface of the processed web substrate 12. The spray device 860 may comprise one or more nozzles or shower heads, such as one or more rows of nozzles, which spray water onto layer 50 located over the web substrate 12. Gravity may be employed to retain the sprayed deionized water on the surface of the transparent conductive oxide layer 50. For example, the web substrate 12 may be at an incline such that the deionized water stays on the surface of the transparent conductive oxide layer 50. The positions of the various output-side rollers 820 can be adjusted to retain the sprayed deionized water on the surface of the transparent conductive oxide layer 50. A deionized water tank 830 can be employed as a reservoir of the deionized water to be supplied to the at least one spray device 860. Alternatively, a water pipe connected to an ion exchange resin or electrodeionization apparatus may be used instead of the deionized water tank 830 to supply deionized water to the spray device 860 (e.g., nozzle(s) or shower head(s)).

At least one dryer 870 can be employed to remove residual deionized water from the surface of the transparent conductive oxide layer 50. The dryer may comprise a fan or blower configured to blow filtered air (or inert gas such as nitrogen) toward the surface of the transparent conductive oxide layer 50. In one embodiment, the direction of the filtered air from the at least one dryer 870 can be directed to push the residual deionized water off the front surface of the transparent conductive oxide layer 50 in conjunction with the gravitational force, for example, by directing the air flow downward and/or outward (away from the center of the web substrate 12). Alternatively, the dryer 870 may comprise a heater which evaporates the water in addition to or instead of the fan or blower.

In one embodiment, the deionized water can be applied to the physically exposed surface of the transparent conductive oxide layer for long enough time to allow bulk diffusion of sodium atoms from within the bulk (i.e., interior) of the transparent conductive oxide layer 50 to reach the outer surface of layer 50 to be rinsed off the outer surface. Sodium is a fast diffuser within the transparent conductive oxide layer 50, the p-doped semiconductor layer 30 and the n-doped semiconductor layer 40. In one embodiment, the deionized water can be applied to the physically exposed surface of the transparent conductive oxide layer for a duration in a range from 5 seconds to 10 minutes. In one embodiment, the deionized water can be applied to the physically exposed surface of the transparent conductive oxide layer for a duration in a range from 20 seconds to 3 minutes.

In one embodiment, the deionized water is applied at an elevated temperature greater than 50 degrees Celsius. In one embodiment, the deionized water is applied at an elevated temperature in a range from 50 degrees Celsius to 100 degrees Celsius. In one embodiment, the deionized water is applied at an elevated temperature in a range from 60 degrees Celsius to 95 degrees Celsius. In one embodiment, the deionized water is applied at an elevated temperature in a range from 70 degrees Celsius to 80 degrees Celsius. In one embodiment, a fluid heater 874 (e.g., a resistive heater) and/or a substrate heater 872 may be employed to maintain the temperature of the fluid (e.g., water provided from the spray device 860) and/or of the web substrate 12 at an elevated temperature in a range from 50 degrees Celsius to 100 degrees Celsius. The fluid heater may be located adjacent to the tank 850 and/or adjacent to the spray device 860 to heat the fluid being provided from the tank 850 through the spray device 860 onto layer 50 over the moving web substrate 12.

While an output spool 810 is provided in the apparatus 1000 of FIG. 2, it is understood that the output spool 810 of FIG. 2 may be replaced with a cutting apparatus 840 illustrated in FIG. 3 in order to provide discrete photovoltaic cells 10.

Alternatively, a fluid tank, such as a deionized water tank 830 may be used to contact the fluid, such as deionized water, to the physically exposed surface of the transparent conductive oxide layer 50 instead of spray device 860, as illustrated in FIGS. 3 and 4. Referring to FIGS. 3 and 4, the deionized water can be applied to the physically exposed surface of the transparent conductive layer 50 by immersing at least the physically exposed surface of the transparent conductive layer 50 located over the web substrate 12 in the tank 830 containing the deionized water or another suitable fluid. Alternatively, the spray device 860 may be used in combination with the components of the module 890 shown in FIG. 3 or 4.

In one embodiment, the web substrate 12 can be fed into the deionized water tank 830 containing deionized water at an entry location L1, and can be continuously extracted from the tank at an exit location L2 as illustrated in FIG. 3. Immersed rollers 822 may be employed to direct the movement of the web substrate 12 within the deionized water tank 830 in conjunction with the output-side rollers 820. At least one dryer 870 (not shown in FIG. 3) can be employed to dry the front surface of the web substrate 12 (which is the front surface of the transparent conductive oxide layer 50) after the web substrate 12 exits the deionized water tank 830 and prior to cutting the web substrate 12 into discrete photovoltaic cells 10. While a cutting apparatus 840 is provided in the apparatus 2000 of FIG. 3, it is understood that the cutting apparatus 840 of FIG. 3 may be replaced with an output spool 810 illustrated in FIG. 2 in order to provide a continuous roll of the photovoltaic device 10.

An interconnection module 900 is located downstream of the fluid treatment module 890 in the web substrate 12 moving direction. The module 900 may be part of the same apparatus 2000 described above or part of a different apparatus. The interconnection module 900 is configured to apply an electrically conductive interconnect 60 to electrically interconnect the transparent conductive oxide layer 50 of each of the photovoltaic cell 10B to the conductive substrate 12 of each adjacent photovoltaic cell 10A after the step of applying the fluid to layer 50 in module 890. For example, the photovoltaic cell 10B, the interconnect 60 and the photovoltaic cell 10A may be sequentially placed on a support, such as a table or conveyor 902, using a handling tool 904, such as a pick and place arm or another tool such that the interconnect 60 overlaps the cells 10A, 10B. For example, cell 10B may be placed on the support first, followed by placing the interconnect 60 over the second electrode 50 of cell 10B such that a portion of the interconnect 60 hangs off to the side of cell 10B, following by placing the substrate 12 side of cell 10A on the portion of the interconnect 60 that hangs off to the side of cell 10B to electrically connect cells 10A and 10B in series. The insulating sheet(s) (64A, 64B) may have a respective top and bottom adhesive surface which faces the electrically conductive part 62 and the respective cell (10A, 10B) to physically attach the interconnect 60 to the cells 10. The handling tool 904 may press the insulating sheet(s) (64A, 64B) and the cells 10 together to attach the adhesive surfaces to the cells 10. Other suitable interconnection modules 900 may also be used. Furthermore, while not shown in FIGS. 2 and 4 for clarity, the module 900 may also be used with the respective apparatus 1000 and 3000 of FIGS. 2 and 4.

In one embodiment, the web substrate 12 may be cut into discrete sheets (which are photovoltaic cells 10) having a predefined size prior to applying the deionized water to the physically exposed surface of the transparent conductive oxide layer 50 as illustrated in FIG. 4. In this case, a cutting apparatus 840 located upstream of the tank 830 (or upstream of the spray device 860 if present) may be employed to cut the web substrate 12 into discrete photovoltaic cells 10, which are subsequently immersed within a deionized water tank 830 for a predefined duration of time. In one embodiment, the cut-up photovoltaic cells 10 can be placed on a support, such as a tray or conveyor, and then provided into the deionized water tank 830 and/or the spray device 860. Subsequently, the photovoltaic cells 10 can be individually removed from the deionized water tank 830 and/or the spray device 860 and dried employing at least one dryer 870.

In one embodiment, the parameters of the various deionized water treatment process described herein can be selected to reduce the bulk sodium concentration in the transparent conductive oxide layer 50. In addition, the Na concentration is also reduced inside the CIGS layer, although not as much (in terms of percentage reduction with respect to the respective original concentration level) as in TCO. The bulk sodium concentration refers to the concentration of sodium within the entire volume of the transparent conductive layer 50, which is different from the concentration of sodium at the surface of the transparent conductive oxide layer 50. While a typical wash or rinse can remove surface impurities, reduction of bulk sodium concentration may involve sufficient duration for bulk diffusion of sodium to the surface to occur. Without wishing to be bound by any particular theory, it is believed that the elevated temperature of the processing steps in conjunction with relatively long time period for the deionized water treatment in comparison with the time scale on which the bulk diffusion of sodium occurs (believed to be on the order of 1 second or less) is responsible for the effective removal of sodium from the transparent conductive layer 50, and lowering of the bulk sodium concentration therein.

In one embodiment, rinsing with the deionized water can reduce the bulk concentration of sodium in the transparent conductive oxide layer by at least 20%. Preferably, rinsing with the deionized water reduces the bulk concentration of sodium in the transparent conductive oxide layer by at least 30%, such as 30 to 45%, including by a concentration of at least $2\times10^{19}$ cm$^{-2}$.

Figure 7:
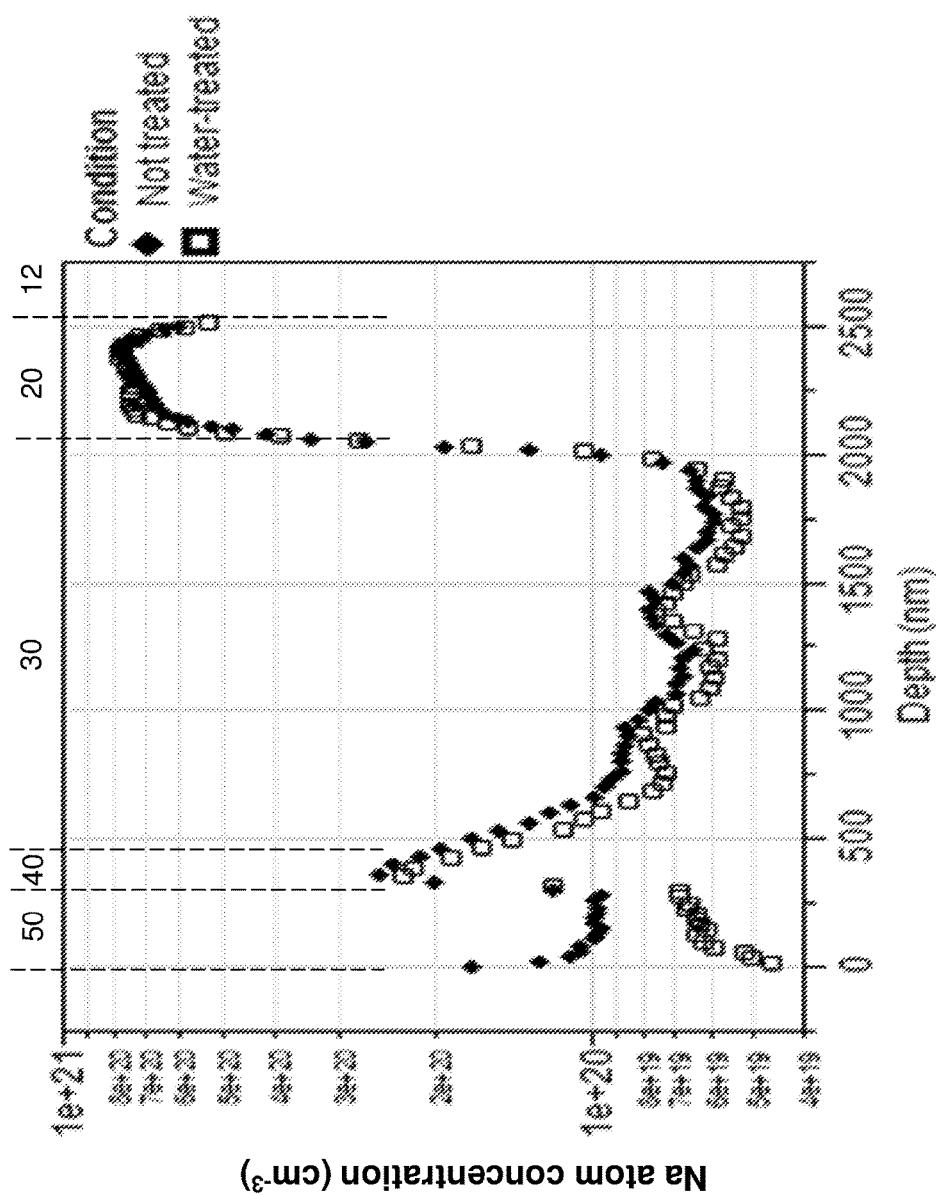
FIG. 7 is a graph illustrating reduction of sodium through water rinsing according to an embodiment of the present disclosure.

FIG. 7 shows secondary ion mass spectroscopy (SIMS) profiles for a reference photovoltaic cell that was not treated with water, and an embodiment photovoltaic cell that was treated with deionized water after forming layer 50 and before contacting layer 50 with the interconnect 60, according to a method of the present disclosure. The reference photovoltaic cell and the embodiment photovoltaic cell were manufactured employing the same apparatus without, and with, the water treatment step, respectively. Reference numerals for the various layers in the photovoltaic cells are shown along with dotted lines that mark the boundaries between the various layers in the photovoltaic cells. The graph of FIG. 7 illustrates that at least 20% reduction in bulk sodium concentration in the transparent conductive oxide layer 50 was achieved by performing the deionized water treatment process.

According to another aspect of the present disclosure, an apparatus (1000, 2000, 3000) for manufacture of a photovoltaic device 10 is provided. The apparatus (1000, 2000, 3000) comprises at least one semiconductor deposition module (such as the combination of the second process module 300 and the third process module 400) configured to form a material stack (30, 40) including a p-n junction on a substrate 12, a conductive oxide deposition module (such as the fourth process module 500) configured to deposit a transparent conductive oxide layer 50 over the material stack (30, 40), and a fluid treatment module 890 configured to contact a physically exposed surface of the transparent conductive oxide layer with a fluid, such as deionized water, to remove sodium from the transparent conductive oxide layer. In one embodiment, the fluid treatment module comprises 890 a water treatment module which is configured to reduce a bulk concentration of sodium in the transparent conductive oxide layer 50 by rinsing a physically exposed surface of the transparent conductive oxide layer 50 with deionized water while sodium atoms diffuse from inside the transparent conductive oxide layer 50 to the physically exposed surface of the transparent conductive oxide layer 50.

In one embodiment, the water treatment module 890 contains a deionized water spray device 860 which is configured to spray the deionized water to the physically exposed surface of the transparent conductive oxide layer 50, as illustrated in FIG. 2.

In one embodiment, the water treatment module 890 comprises a deionized water tank 830 configured to immerse at least the physically exposed surface of the transparent conductive layer in the deionized water. For example, the water treatment module can be configured to apply the deionized water to the physically exposed surface of the transparent conductive oxide layer 50 by immersing at least the physically exposed surface of the transparent conductive layer 50 in the deionized water tank 830 containing the deionized water, as illustrated in FIGS. 3 and 4.

In one embodiment, the water treatment module 890 can be sized such that deionized water contacts to the physically exposed surface of the transparent conductive oxide 50 for a duration in a range from 5 seconds to 10 minutes. For example, the substrate 12 movement speed through the module 890 and the number, size and position of the deionized water spray device 860, the size of the tank 830 and/or the spacing between the device 860 or 830 and the dryer 870 may be selected such that the deionized water remains in contact with the physically exposed surface of the transparent conductive oxide 50 for a duration in a range from 5 seconds to 10 minutes.

In one embodiment, the water treatment module 890 contains a heater 872 and/or 874 which are configured to heat the deionized water which contacts the physically exposed surface of the transparent conductive oxide layer at an elevated temperature in a range from 50 degrees Celsius to 100 degrees Celsius.

In one embodiment, the apparatus (1000, 2000, 3000) can be configured to process a web substrate 12 by moving the web substrate 12 through the optional first process module 200, the at least one semiconductor deposition module (300, 400) and the conductive oxide deposition module 500 and to the water treatment module 890. In one embodiment, the apparatus (1000, 2000) can be configured to move the web substrate 12 to the water treatment module 890 without cutting the web substrate 12 or prior to cutting the web substrate 12, as illustrated in FIGS. 2 and 3. At least one copper indium gallium sputtering target 310 and a selenium evaporator 320 may be located in the at least one semiconductor deposition module 300. At least one molybdenum and sodium containing sputtering target 210 may be located in the first process module 200 located upstream of the at least one semiconductor deposition module (300, 400) in the web substrate 12 moving direction.

In one embodiment, the fluid treatment module 890 comprises a deionized water tank 830 containing submerged rollers 822 which are configured to feed the web substrate 12 through the deionized water tank 830. Specifically, the apparatus 2000 can be configured to feed the web substrate 12 into a tank 830 containing the deionized water at an entry location L1, and to continuously extract the web substrate 12 from the tank at an exit location L2 as illustrated in FIG. 3.

In one embodiment, the module 800 contains a cutting apparatus 840 which is configured to cut the web substrate 12 into photovoltaic cells 10 (e.g., into photovoltaic cell sheets). The cutting apparatus 840 may be located downstream of the fluid treatment module 890 in the web substrate moving direction, as shown in FIG. 3.

Alternatively, the cutting apparatus 840 may be located upstream of the fluid treatment module 890 in the web substrate moving direction, as shown in FIG. 4. In this embodiment, the physically exposed surface of the transparent conductive oxide layer 50 of the cut photovoltaic cells 10 is contacted with the fluid (e.g., deionized water) to remove sodium from the transparent conductive oxide layer 50. Thus, the apparatus 3000 can be configured to cut the web substrate 12 into discrete sheets of photovoltaic cells 10 having a predefined size prior to applying the deionized water to the physically exposed surface of the transparent conductive oxide layer 50, as illustrated in FIG. 4.

In another embodiment, an interconnection module 900 is located downstream of the fluid treatment module 890 in the web substrate 12 moving direction. The interconnection module 900 is configured to apply an electrically conductive interconnect 60 to electrically interconnect the transparent conductive oxide layer 50 of each of the photovoltaic cell 10 to the conductive substrate 12 of each adjacent photovoltaic cell 10.

In one embodiment, the apparatus (1000, 2000, 3000) can be configured such that rinsing with the deionized water reduces the bulk concentration of sodium in the transparent conductive oxide layer 50 by at least 20%.

Another aspect of this invention is related to subjecting the photovoltaic cell to an thermal annealing step, which could be applied before, after or even instead of the water treatment step. This annealing step may lead to a further reduction of Na concentration in the cell. In addition, the thermal annealing step leads to a significant reduction in free carrier concentration which is an important factor in defining solar cell performance.

While sputtering was described as the preferred method for depositing all layers onto the substrate, some layers may be deposited by MBE, CVD, evaporation, plating, etc. It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the photovoltaic cells of the embodiments of the present disclosure.

What is claimed is:

1. A semiconductor device manufacturing apparatus, comprising:
   at least one semiconductor deposition module configured to form a semiconductor material stack including a p-n junction on a substrate;
   a conductive oxide deposition module configured to deposit a transparent conductive oxide layer over the semiconductor material stack; and
   a fluid treatment module configured to contact a physically exposed surface of the transparent conductive oxide layer with a fluid to remove sodium from the transparent conductive oxide layer.

2. The apparatus of claim 1, wherein the fluid treatment module comprises a water treatment module.

3. The apparatus of claim 2, wherein the water treatment module comprises a deionized water spray device which is configured to spray the deionized water to the physically exposed surface of the transparent conductive oxide layer.

4. The apparatus of claim 2, wherein the water treatment module comprises a deionized water tank, and wherein the water treatment module is configured to immerse at least the physically exposed surface of the transparent conductive layer in the deionized water tank containing the deionized water.

5. The apparatus of claim 2, wherein:
   the water treatment module is sized such that deionized water contacts the physically exposed surface of the transparent conductive oxide layer for a duration in a range from 5 seconds to 10 minutes; and
   the water treatment module contains a heater configured to heat the deionized water which contacts the physically exposed surface of the transparent conductive oxide layer at an elevated temperature in a range from 50 degrees Celsius to 100 degrees Celsius.

6. The apparatus of claim 1, wherein the apparatus is configured to process a web substrate as the substrate by moving the web substrate through the at least one semiconductor deposition module and the conductive oxide deposition module and to the fluid treatment module.

7. The apparatus of claim 6, wherein the apparatus is configured to move the web substrate to the fluid treatment module without cutting the web substrate or prior to cutting the web substrate.

8. The apparatus of claim 7, wherein fluid treatment module comprises a deionized water tank containing submerged rollers which are configured to feed the web substrate through the deionized water tank.

9. The apparatus of claim 7, further comprising a cutting apparatus configured to cut the web substrate into photovoltaic cells, wherein the cutting apparatus is located downstream of the fluid treatment module in the web substrate moving direction.

10. The apparatus of claim 6, further comprising a cutting apparatus configured to cut the web substrate into photovoltaic cells, wherein the cutting apparatus is located upstream of the fluid treatment module in the web substrate moving direction, wherein the physically exposed surface of the transparent conductive oxide layer of the photovoltaic cells is contacted with the fluid to remove sodium from the transparent conductive oxide layer.

11. The apparatus of claim 6, further comprising:
    an interconnection module located downstream of the fluid treatment module in the web substrate moving direction, wherein the interconnection module is configured to apply an electrically conductive interconnect to electrically interconnect the transparent conductive oxide layer of each of the photovoltaic cell to the substrate of each adjacent photovoltaic cell;
    at least one copper indium gallium sputtering target and a selenium evaporator are located in the at least one semiconductor deposition module; and
    at least one molybdenum and sodium containing sputtering target located in a process module located upstream of the at least one semiconductor deposition module in the web substrate moving direction.

* * * * *